United States Patent [19]

Takasu et al.

[11] Patent Number: 5,614,766
[45] Date of Patent: Mar. 25, 1997

[54] SEMICONDUCTOR DEVICE WITH STACKED ALTERNATE-FACING CHIPS

[75] Inventors: Hidemi Takasu; Takanori Ozawa; Noriyuki Shimoji, all of Kyoto, Japan

[73] Assignee: Rohm Co., Ltd., Kyoto, Japan

[21] Appl. No.: 556,103

[22] Filed: Nov. 9, 1995

Related U.S. Application Data

[63] Continuation-in-part of Ser. No. 246,416, May 20, 1994, abandoned, which is a continuation of Ser. No. 852,790, Mar. 17, 1992, abandoned.

[30] Foreign Application Priority Data

Sep. 30, 1991 [JP] Japan ................................. 3-251524

[51] Int. Cl.$^6$ .......................... H01L 23/48; H01L 23/52; H01L 29/40
[52] U.S. Cl. ....................... 257/777; 257/723; 257/786; 257/783
[58] Field of Search ................................. 257/777, 685, 257/686, 723, 724, 786, 783

[56] References Cited

U.S. PATENT DOCUMENTS

| | | | |
|---|---|---|---|
| 3,256,465 | 6/1966 | Weissenstern et al. | 257/777 |
| 3,577,037 | 5/1971 | De Pietro et al. | 257/777 |
| 4,763,188 | 8/1988 | Johnson | 257/777 |
| 5,422,435 | 6/1995 | Takiar et al. | 257/777 |

FOREIGN PATENT DOCUMENTS

| | | | |
|---|---|---|---|
| 58-92230 | 6/1983 | Japan | 257/777 |
| 58-203117 | 5/1985 | Japan | 257/777 |
| 2-74046 | 3/1990 | Japan | 257/777 |
| 5-13663 | 1/1993 | Japan | 257/777 |

*Primary Examiner*—Stephen Meier
*Assistant Examiner*—S. V. Clark
*Attorney, Agent, or Firm*—Morrison Law Firm

[57] ABSTRACT

The present invention relates to a structure of semiconductor chip joint for mounting a plurality of semiconductor chips onto a single package. The joint comprises two or more semiconductor chips, the chips each having an element formation surface and a rear surface and being piled up with their element formation surfaces directed either in a first direction or in a second direction by turns so that their element formation surfaces are opposed to each other while their rear surfaces are opposed to each other, a bonding pad provided on the element formation surface of the chip directed in the first direction, connecting pad provided on the element formation surface of the chip directed both in the first direction and in the second direction;

wherein the chip whose element formation surface is directed in the second direction is piled on so that the bonding pad of the chip whose element formation surface is directed in the first direction is exposed, and the chip whose element formation surface is directed in the first direction and the chip whose element formation surface is directed in the second direction are electrically connected to each other through their respective connecting pads with a conductive bump.

3 Claims, 7 Drawing Sheets

FIG. 7F

SEMICONDUCTOR DEVICE WITH STACKED ALTERNATE-FACING CHIPS

This is a continuation in part of application Ser. No. 08/246,416, May. 20, 1994, now abandoned, which is a continuation of earlier application Ser. No. 07/852,790, Mar. 17, 1992, now abandoned.

BACKGROUND OF THE INVENTION

1. Field of the Invention

The present invention relates to semiconductor device and, more particularly, to a structure of semiconductor chips for mounting a plurality of semiconductor chips onto a single package.

2. Description of the Prior Art

Normally, semiconductor device are used with a single semiconductor chip mounted on a single package. However, in order to increase the degree of integration, there are some cases in which a plurality of semiconductor chips are mounted within a single package.

Figure 1:
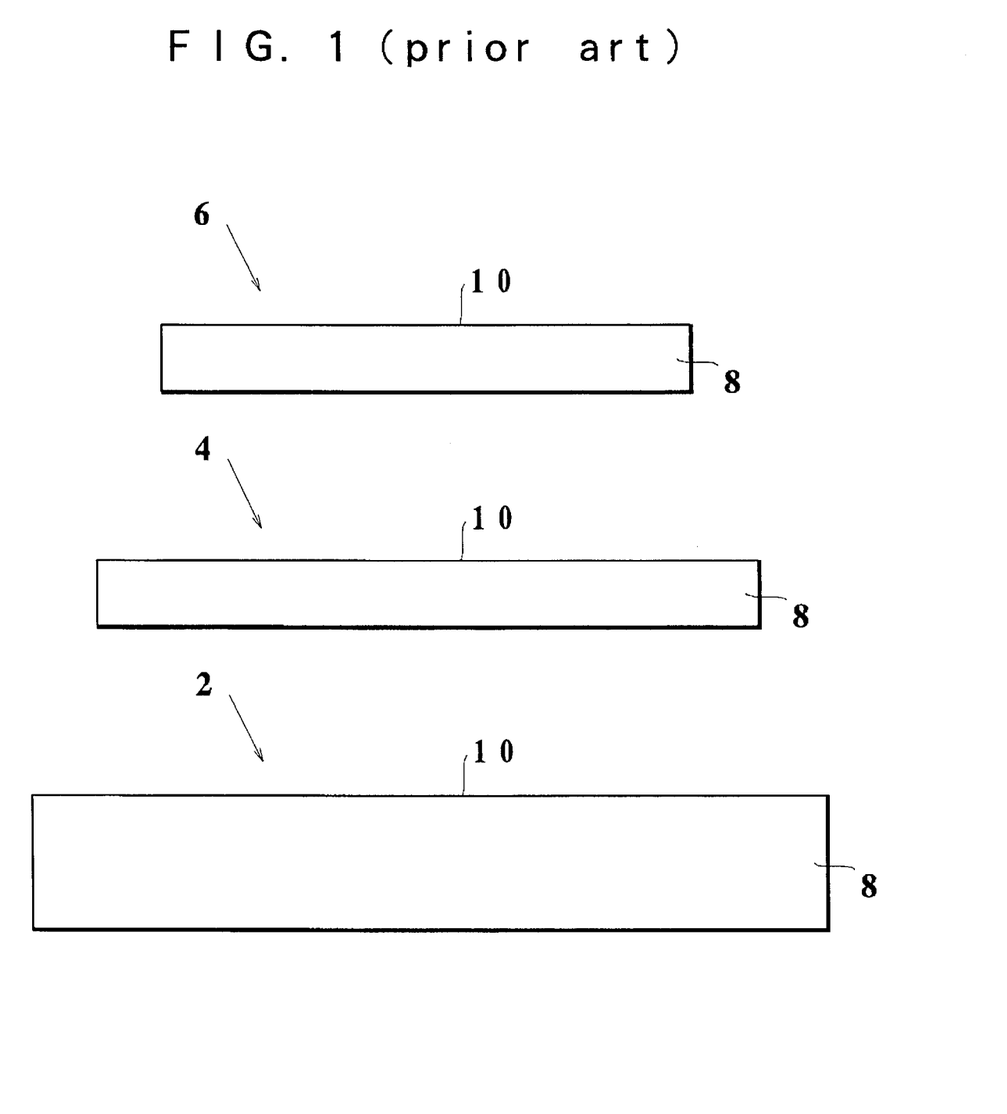
FIG. 1 is a view showing semiconductor chips having different volumes.

Described below is a case in which a semiconductor chip 2, a semiconductor chip 4, and a semiconductor chip 6, as shown in FIG. 1, are mounted onto a single package. The chips 2, 4, and 6 are assumed to be as illustrated in the figure in their volume ratio. In each case, it is also assumed that a substrate 8 has an element portion 10 formed on its surface.

Figure 2A:
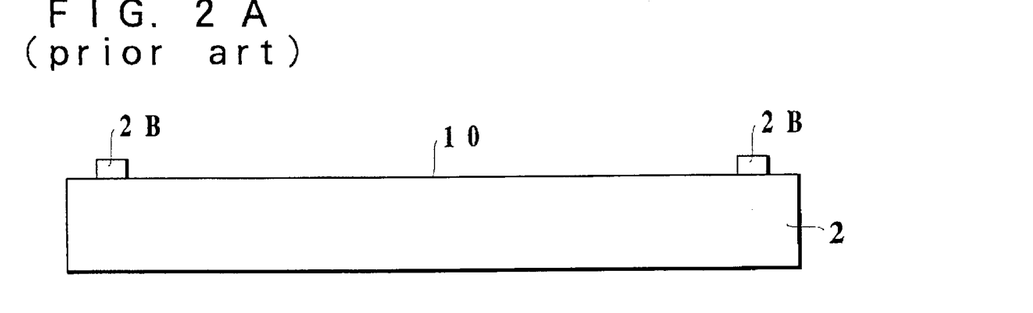
FIGS. 2A to 2C are views showing the process of manufacturing the semiconductor chip joint 14 of a conventional semiconductor device.
Figure 2B:
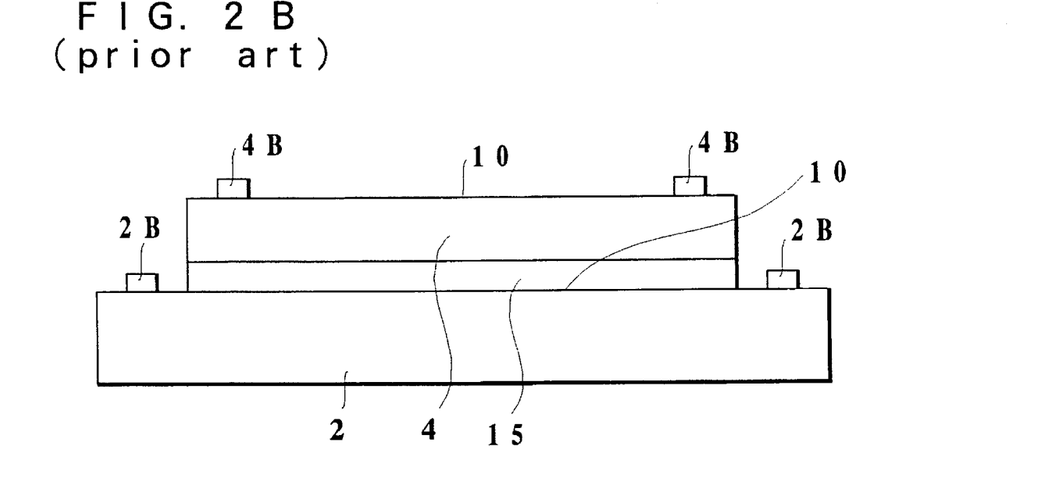
Figure 2C:
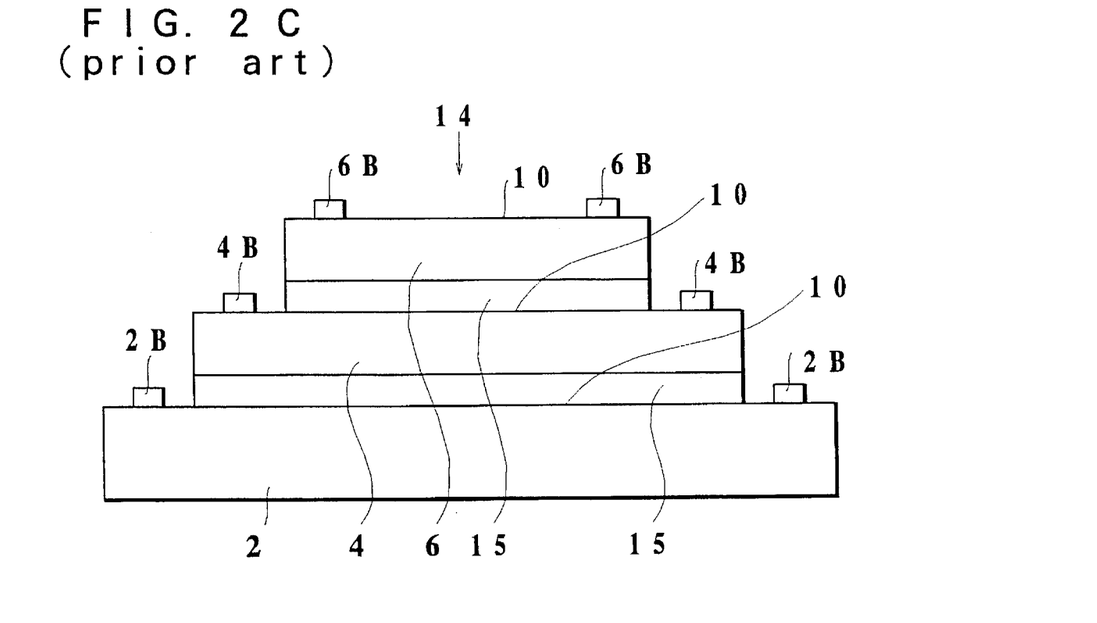

First, a bonding pad 2B is formed on an element formation surface of the chip 2 (FIG. 2A). The element formation surface of the chip 2 and the rear surface of the chip 4 on which a bonding pad 4B has been formed are bonded together with a nonconductive adhesive 15 such as epoxy resin (FIG. 2B). Similarly, the element formation surface of the chip 4 and the rear surface of the chip 6 on which a bonding pad 6B has been formed are bonded together with the adhesive 15 (FIG. 2C).

Figure 3:
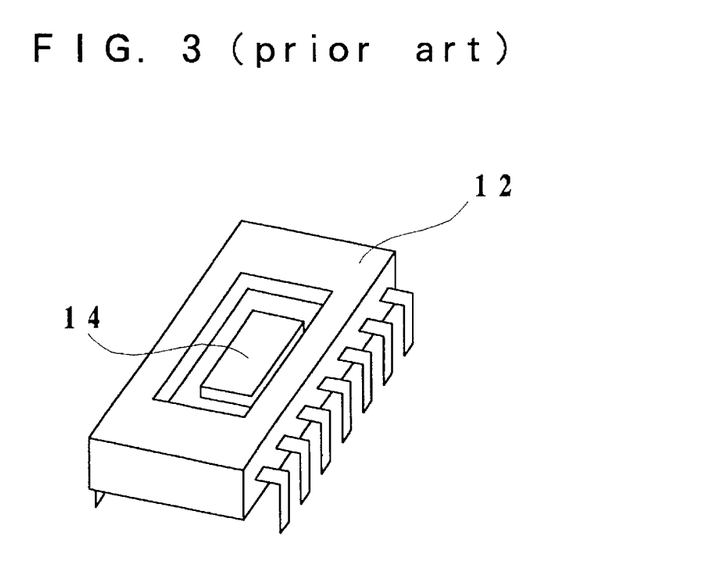
FIG. 3 is a view showing a state in which the chip joint has been mounted on a ceramic package.

A semiconductor chip joint 14 thus constructed is then mounted onto a ceramic package 12 (see FIG. 3). Next, the bonding pad of the semiconductor chip joint 14 and respective conducting terminals on the outer end of the package 12 surrounding the chip are bonded together with a wire (normally aluminum wire). This can be performed by the normal wire bonding technique (not shown).

Thereafter, the package is covered with a cap and welding-sealed (not shown).

Also, among other methods by which a plurality of chips are mounted onto a single package, there is a method which employs new packages with the use of tabs (Nikkei Micro Device, Apr. 1991, p. 80).

Figure 4:
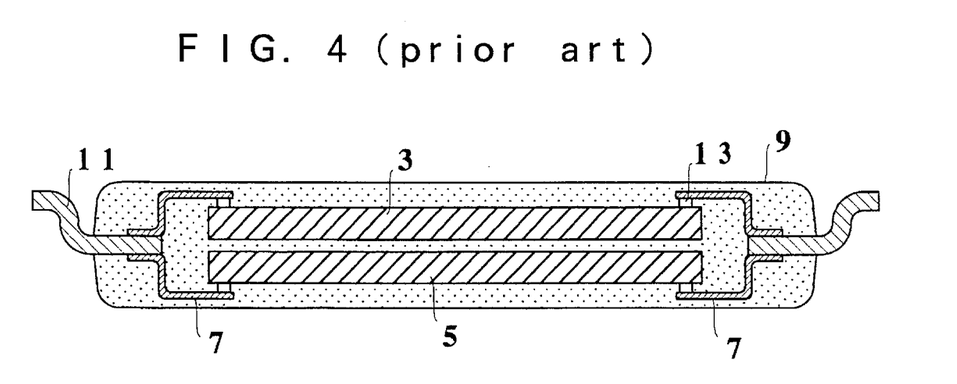
FIG. 4 is a sectional view of a plurality of semiconductor chips accommodated in a package by a conventional mounting method.

This method is one in which two semiconductor chips 3 and 5 are sealed with their rear surfaces opposed to each other and then connected to lead frames 11 of a package 9 using tabs 7 (see FIG. 4).

Now the bonding process through which the chips and the lead frames are electrically connected is described below. The chips 3, 5 and the lead frames 11 are connected with the tabs 7 interposed therebetween. One end of a tab 7 is connected to the chip 3 using an Au bump 13 provided to the chip 3. Then the other end of the tab 7 is attached to one side of a lead frame 11. With the lead frame 11 turned over, the opposite side of the lead frame 11 and the chip 5 are connected through the Au bump 13 provided to the chip 5, using the tabs 7 in the same way as described above. Thereafter, the same process is repeatedly carried out so as to connect another lead frame to the chips 3 and 5.

Such a method as described above allows a plurality of semiconductor chips to be mounted onto a small-sized package.

Disadvantageously, however, such a high-density mounting method as described above has suffered from the following problems.

In the method as shown in FIG. 2, a chip to be piled on another is required to be smaller in area than that positioned below so as to allow a good use of the normal wire bonding technique. This requirement has caused limitations in terms of high-density mounting.

Meanwhile, the mounting method employing new packages with the use of tabs as shown in FIG. 4, although superior in terms of the degree of mounting integration, has had a problem that it cannot use the normal wire bonding technique, thus being complex in its bonding process.

SUMMARY OF THE INVENTION

Accordingly, the object of the present invention is to provide an semiconductor device which allows having a lot of semiconductor chips its package and connecting the semiconductor chips to respective conductive terminals of the package by the normal wire bonding technique, whereby the foregoing problems can be solved.

In accordance with a characteristics of the present invention, two or more semiconductor chips each having an element-formation surface and an opposite rear surface, and being stacked with their element-formation-surfaces alternately directed either in a first direction or in an opposite second direction by turns so that their element-formation surfaces are facing each other or their rear surfaces are facing each other, adhesive materials located in between the rear surfaces facing to each other to bond the rear surfaces of the semiconductor chips, a bonding pad provided on an element-formation surface of a semiconductor chip directed in the first direction, a connecting pad provided on an element-formation surface of a semiconductor chip directed in the first direction, and a connecting pad provided on an element-formation surface of a semiconductor chip directed in the second direction, wherein the semiconductor chip whose element-formation surface is directed in the second direction is piled on so that the bonding pad of the semiconductor chip whose element-formation surface is directed in the first direction is exposed, while the semiconductor chip whose element-formation surface is directed in the first direction and the semiconductor chip whose element-formation surface is directed in the second direction are electrically connected to each other by connecting each of their connecting pads facing each other respectively, and wherein continuity of the semiconductor chips that have their rear surfaces facing each other can be chosen as the semiconductor chips being electrically connected or electrically disconnected using either conductive materials or nonconductive materials respectively for the adhesive materials.

Also, in accordance with another characteristics of the present invention, two or more semiconductor chips each having an element-formation surface and an opposite rear surface, and being stacked with their element-formation surfaces alternately either in a first direction or in an opposite second direction by turns so that either their element-formation surfaces are facing to each other or their rear surfaces are facing to each other, adhesive materials located in between the rear surfaces facing to each other to bond the facing rear surfaces of the semiconductor chips and the adhesive materials having nonconductive characteristics, in order to electrically disconnect the semiconductor chips that their rear surfaces opposed to each other, a bonding pad provided on an element-formation surface of a semiconductor chip directed in the first direction, a connecting pad provided on an element-formation surface of a semiconductor chip directed in the first direction, and a connecting pad provided on an element-formation surface of a semiconductor chip directed in the second direction, wherein the semiconductor chip whose element-formation surface is directed in the second direction is stacked so that the bonding pad of the semiconductor chip whose element-formation surface is directed in the first direction is exposed, while the semiconductor chip whose element-formation surface is directed in the first direction and the semiconductor chip whose element-formation surface is directed in the second direction are electrically connected to each other by connecting each of their respective connecting pads facing each other.

In accordance with still another characteristic of the present invention, two or more semiconductor chips each having an element-formation surface and an opposite rear surface, and being stacked with their element-formation surfaces alternately either in a first direction or in an opposite second direction by turns so that either their element-formation surfaces are facing each other or their rear surfaces are facing each other, a bonding pad provided on an element-formation surface of a semiconductor chip directed in the first direction, a connecting pad provided on an element-formation surface of a semiconductor chip directed in the first direction, and a connecting pad provided on an element-formation surface of a semiconductor chip directed in the second direction, wherein the semiconductor chip whose element-formation surface is directed in the second direction is stacked on so that the bonding pad of the semiconductor chip whose element-formation surface is directed in the first direction is exposed, while the semiconductor chip whose element-formation surface is directed in the first direction and the semiconductor chip whose element-formation surface is directed in the second direction are electrically connected to each other by connecting at least a respective pair of facing connecting pads through a conductive bump, and a piece of the conductive bump is located between the pair of connecting pads.

While the novel features of the invention are set forth in a general fashion, particularly in the appended claims, the invention, both as to organization and content, will be better understood and appreciated, along with other objects and features thereof, from the following detailed description taken in conjunction with the drawings.

DETAILED DESCRIPTION OF THE PREFERRED EMBODIMENT

Figure 5A:
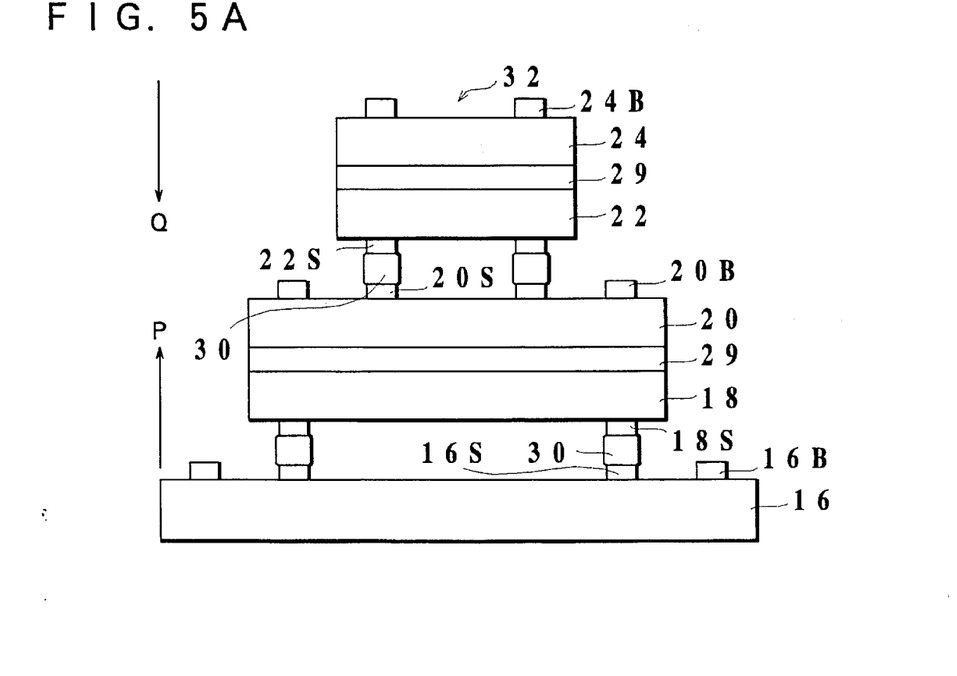
FIG. 5A is a front view of a chip joint of a semiconductor device according to an embodiment of the present invention and FIG. 5B is a view as FIG. 5A is viewed in direction Q.
Figure 5B:
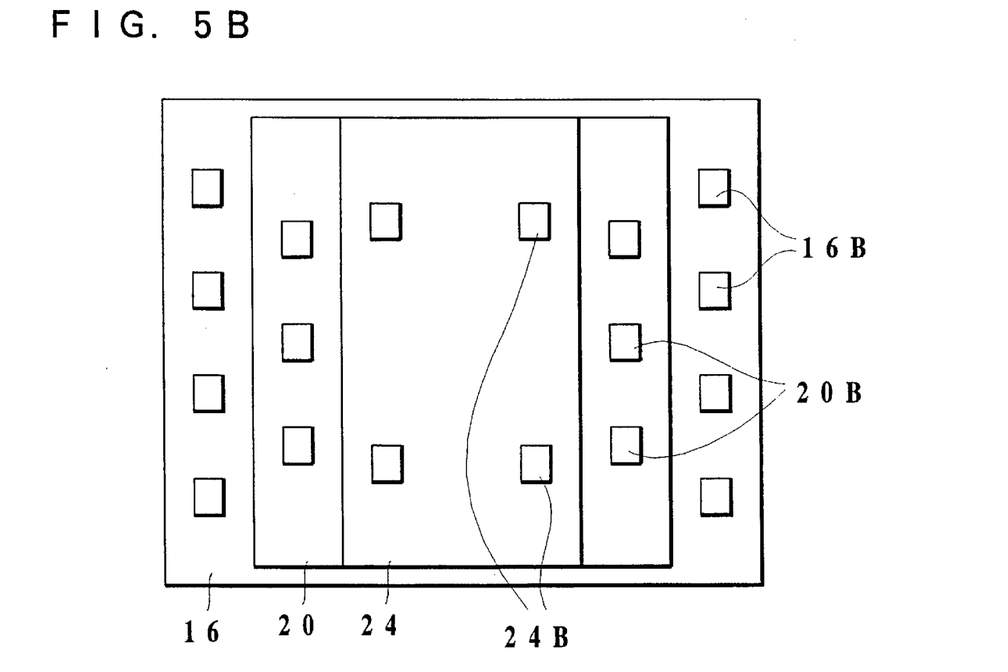

FIG. 5 shows the structure of a chip joint of a semiconductor device according to an embodiment of the present invention. FIG. 5A is a front view of the chip joint, and FIG. 5B is a view as FIG. 5A is viewed in direction Q.

This semiconductor device is provided with five pieces of semiconductor chips each having an element-formation surface and a rear surface. Semiconductor chips 16, 20, and 24 are provided with bonding pads and connecting pads on their element-formation surfaces. Further, chips 18 and 22 are provided with connecting pads on their element-formation surfaces.

As shown in FIG. 5, the element-formation surface of the semiconductor chip 16 is directed in direction P, a first direction. Stacked on the element-formation surface of the chip 16 is the semiconductor chip 18, whose element-formation surface is directed in direction Q, a second direction, where the chips 16 and 18 are electrically connected to each other with connecting pads through bumps 30 interposed therebetween. This means that the chips 16 and 18 are arranged with their element-formation surfaces opposed to each other. In this state, a bonding pad 16B provided on the element-formation surface of the chip 16 is exposed. Further, stacked on the rear surface of the chip 18 is the semiconductor chip 20, whose element-formation surface is directed in direction P, both chips being joined together. In other words, the chips 18 and 20 have their rear surfaces opposed to each other.

Similarly, the chips 20 and 22 are electrically connected to each other by their element-formation surfaces, while the chips 22 and 24 are joined together by their rear surfaces. In this state, a bonding pad 20B provided on the element-formation surface of the chip 20 is exposed.

In a structure in which a plurality of chips are stacked up as above, the volume occupied by a number of chips is small enough to allow high-density mounting. Furthermore, the normal wire bonding technique as described later can be used for bonding.

Now the process of manufacturing semiconductor device having such a structure as shown in FIG. 5 is described hereinbelow with reference to FIGS. 6A to 6F. Throughout the FIGS. 6A to 6F, on the right side are front views, and left are the views as corresponding right hand views are viewed in direction Q.

Figure 6A:
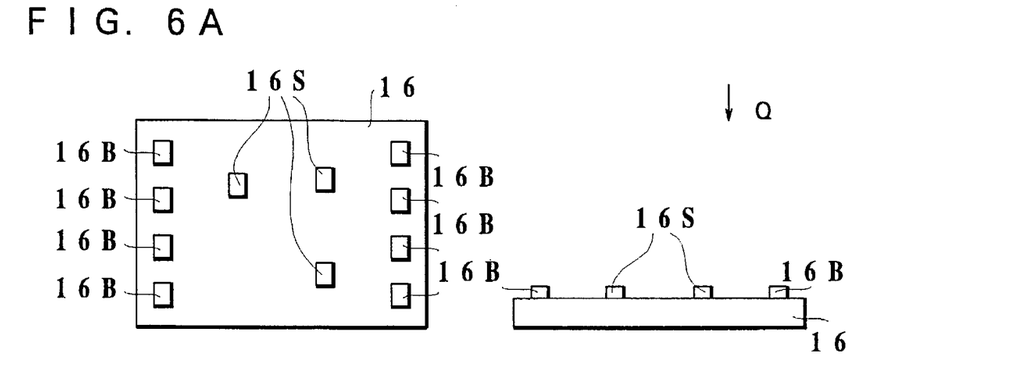
FIGS. 6A to 6F are views showing the process of manufacturing a chip joint 32 according to an embodiment of the present invention.
Figure 6B:
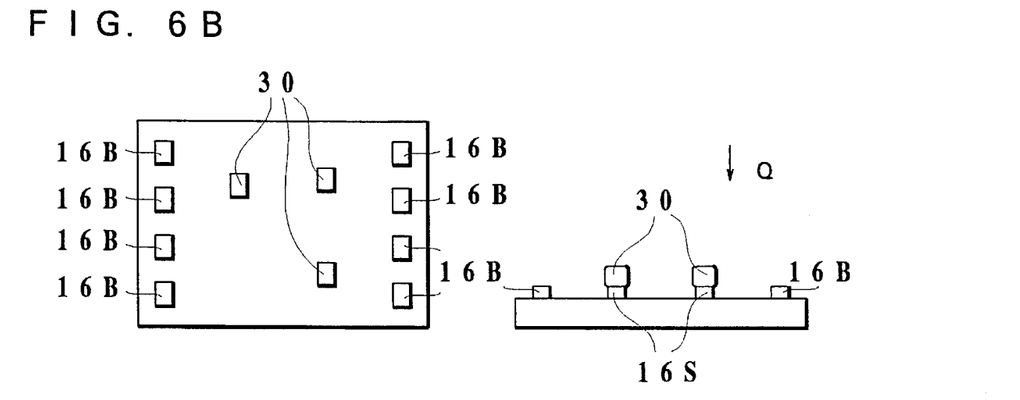
Figure 6C:
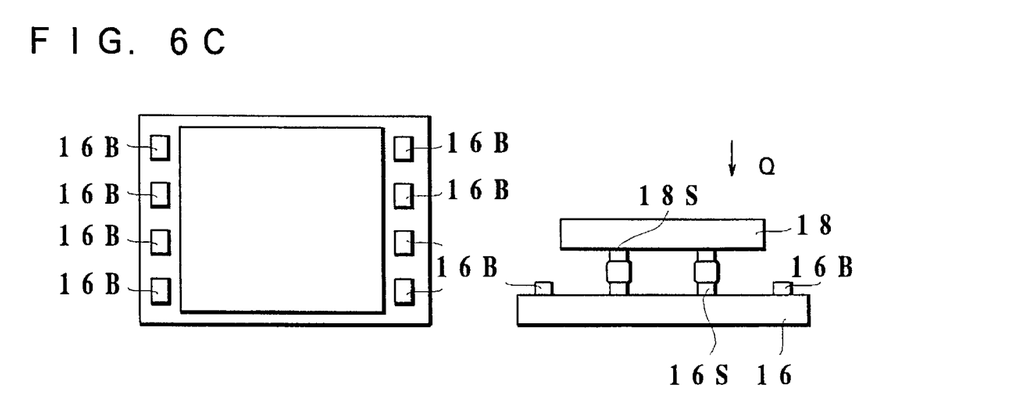

On the element-formation surface of the semiconductor chip 16, there are formed bonding pads 16B and connecting pads 16S (FIG. 6A). Conductive bumps 30 are formed to the connecting pads 16S on the element-formation surface of the chip 16 (FIG. 6B). Connecting pads 18S on the element-formation surface of the chip 18 are connected to the connecting pads 16S through the conductive bumps 30 (FIG. 6C). That is, the connecting pads 16S and the connecting pads 18S are electrically connected to each other though a piece of conductive bump 30.

Figure 6D:
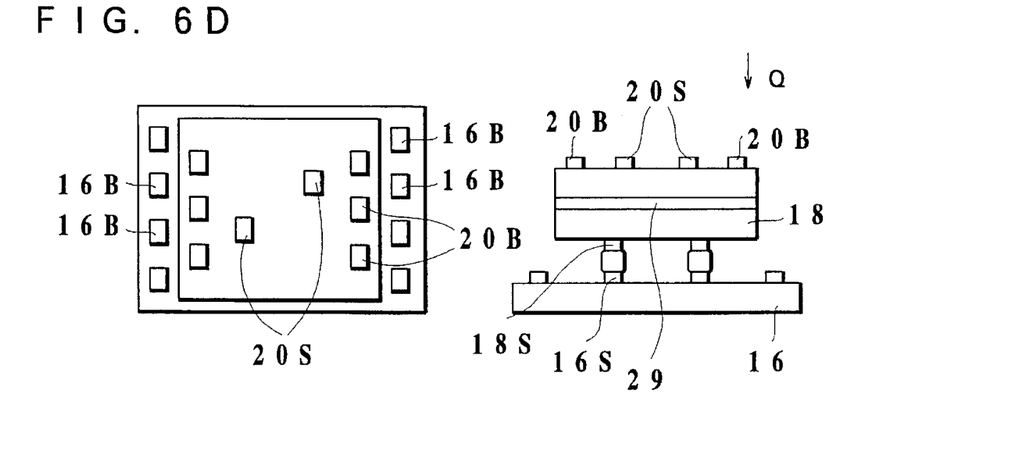

Further, the chip 18 and the chip 20 are bonded together by their rear surfaces using a chip connecting adhesive 29 (adhesive materials) as shown in FIG. 6D. It is possible to use either of conductive materials or nonconductive materials for the chip connecting adhesive 29. The chip 18 and the chip 20 are electrically disconnected with each other when the chip connecting adhesive 29 made of nonconductive materials is used for bonding those chips. Even when conductivity types of well of the chip 18 and the chip 20 are different from each other, both the chip 18 and the chips 20 can be stacked up. In other words, it is possible to stack those chips one having an N type well and the other having a P type well.

Figure 6E:
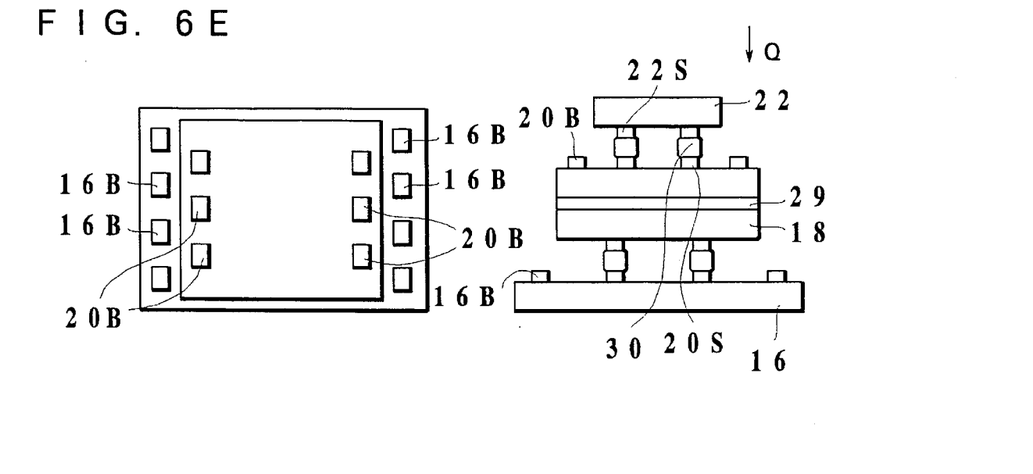
Figure 6F:
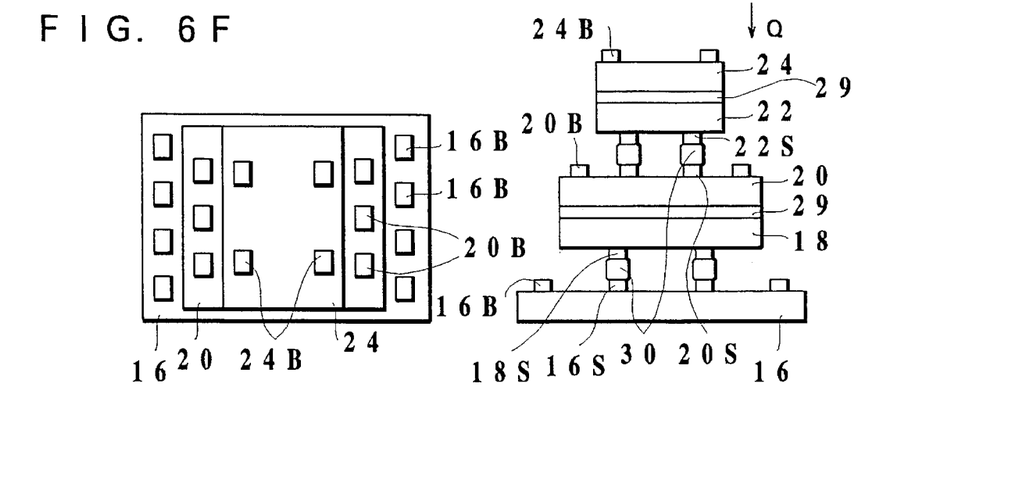
Figure 7A:
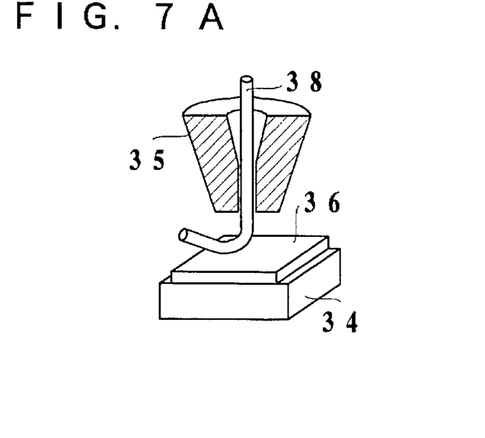
FIGS. 7A to 7F are views showing the normal wire bonding technique.
Figure 7B:
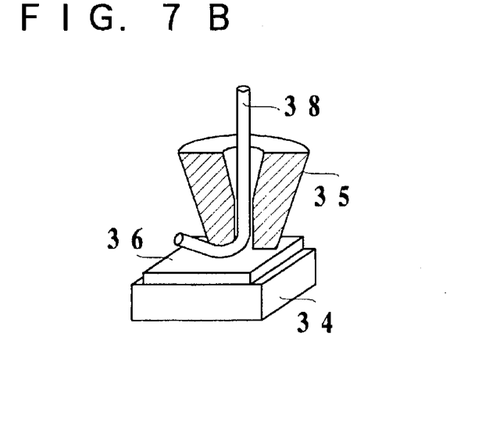
Figure 7C:
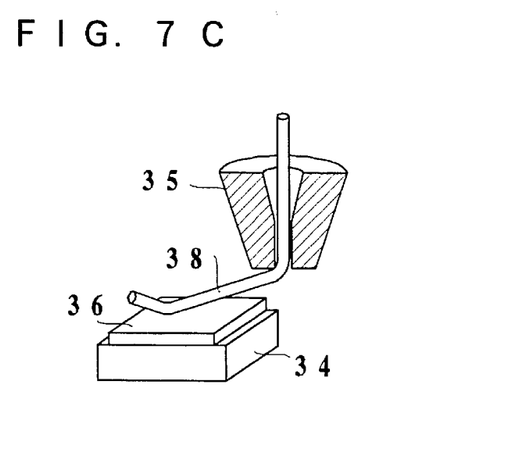
Figure 7D:
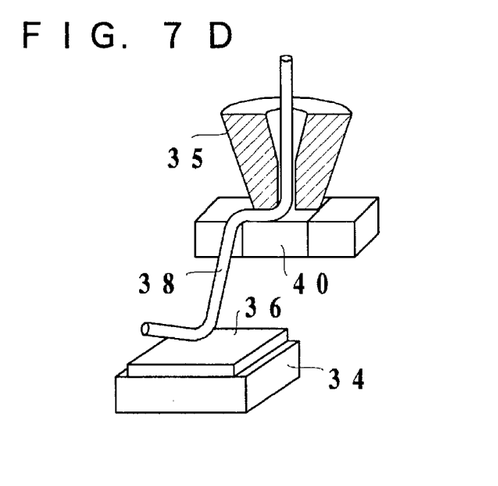
Figure 7E:
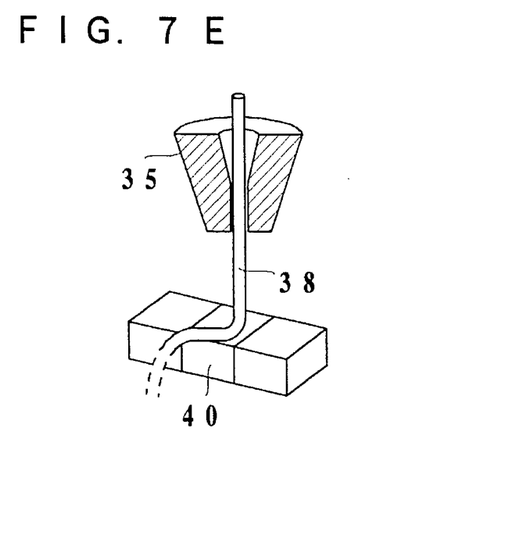
Figure 7F:
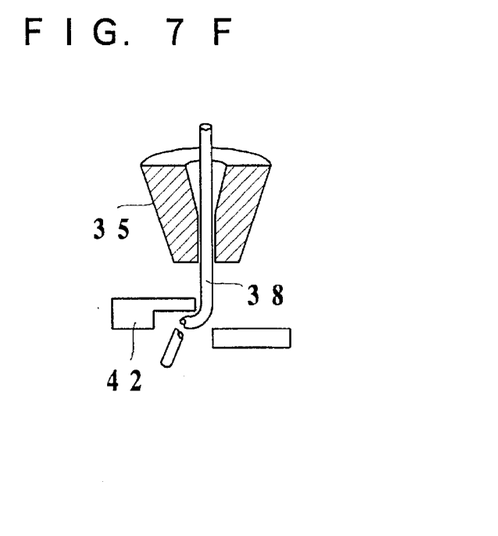

Successively, the bumps 30 are formed to connecting pads 20S on the element-formation surface of the chip 20, and connecting pads 22S on the element-formation surface of the chip 22 are connected with the connecting pads 20S through the piece of conductive bumps 30 (FIG. 6E). Further, the chip 22 and the chip 24 are bonded together by their rear surfaces with the chip connecting adhesive 29 (FIG. 6F). Either of conductive materials or nonconductive materials can be used for the chip connecting adhesive 29 to bond the chip 22 and the chip 24 as described above.

The semiconductor chip joint 32 thus formed is mounted onto a ceramic package (see FIG. 3), and then connected to the lead frames of the package by the normal ultrasonic wire bonding technique. The normal ultrasonic wire bonding method is detailed below.

As shown in FIGS. 7A to 7F, capillaries 35 and others are used to exercise the method. A wire 38 is bonded with a pad 36 provided onto a semiconductor chip 34. The wire 38 is successively bonded with an outer end terminal 40. Finally the wire 38 is cut with a cutter 42 (see FIG. 7F). This process, allowing wire bonding from the element-formation surface of a chip as shown above, facilitates the work involved.

Thereafter, the package is covered with a cap, and welding-sealed (not shown).

Since the semiconductor device according to the present invention has semiconductor chips piled up with their element-formation surfaces changed in direction by turns, it is possible to mount a number of semiconductor chips onto a single package.

Moreover, bonding pads of the individual chips electrically independent each other are exposed, which allows connecting the bonding pads to respective conductive terminals by the normal wire bonding technique. As a result, the manufacturing process involved is simple and the semiconductor device can be readily manufactured.

In consequence, numerous semiconductor chips can be mounted onto a single package using the normal wire bonding technique.

Further, in an embodiment of the present invention, since either of conductive materials or nonconductive materials are located in between the rear surfaces opposed to each other to bond the rear surfaces of the semiconductor chips. So that, continuity of the semiconductor chips can be chosen as either electrically connected or electrically disconnected.

As a result of that, it is possible to provide a semiconductor device which allows connection of the semiconductor chips as either electrically connected or electrically disconnected.

Also, another embodiment of a semiconductor device in the present invention, because of nonconductive materials are located in between the rear surfaces opposed to each other. So that, those chips are electrically disconnected each other.

As a result of that, a plurality of semiconductor chips can be stacked up even when the semiconductor chips having different conductivity types of well are used. Therefore, semiconductor devices having various combination can be provided.

Further, far another embodiment of a semiconductor device in the present invention, the connecting pads being provided as at least a pair on the semiconductor chips whose element surfaces opposed to each other are connected through a piece of conductive bump.

So that, electrical resistance induced between the connecting pads can be decreased in comparison with when plural pieces of conductive bumps are respectively connected to every pair of the connecting pads being provided on the element surfaces opposed to each other. Additionally, manufacturing process can be simplified, due to provide a piece of conductive bump for connecting the connecting pads.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor device comprising:

a plurality of semiconductor chips each having an element-formation surface and a rear surface opposite said element-formation surface, said semiconductor chips stacked alternatingly such that respective element-formation surfaces of every neighboring pair of said plurality of semiconductor chips face in opposite first and second directions;

an adhesive material between said rear surfaces that face each other to bond said rear surfaces that face each other, said adhesive material is one of an electrical conductor or an electrical insulator;

a bonding pad provided on said respective element-formation surface facing said first direction, said bonding pad is exposed;

a first connecting pad provided on said respective element-formation surface facing said first direction; and a second connecting pad provided on said respective element-formation surface facing said second direction, said second connecting pad and said first connecting pad of respective element-formation surfaces that face each other are electrically connected.

2. A semiconductor device comprising:

a plurality of semiconductor chips each having an element-formation surface and a rear surface opposite said element-formation surface, said semiconductor chips stacked alternatingly such that respective element-formation surfaces of every neighboring pair of said plurality of semiconductor chips face in opposite first and second directions;

a nonconductive adhesive material between rear surfaces that face each other to bond and to electrically disconnect said rear surfaces that face each other;

a bonding pad provided on said respective element-formation surface facing said first direction, said bonding pad is exposed;

a first connecting pad provided on said respective element-formation surface facing said first direction; and a second connecting pad provided on said respective element-formation surface facing said second direction, said second connecting pad and said first connecting pad os respective element-formation surfaces that face each other are electrically connected.

3. A semiconductor device comprising:

a plurality of semiconductor chips each having an element-formation surface and a rear surface opposite said element-formation surface, said semiconductor chips being stacked alternatingly such that respective element-formation surfaces of every neighboring pair of said plurality of semiconductor chips are facing in opposite first and second directions;

a bonding pad provided on said respective element-formation surface facing said first direction, said bonding pad is exposed;

a first connecting pad provided on said respective element-formation surface facing said first direction;

a second connecting pad provided on said respective element-formation surface facing said second direction; and a conductive bump electrically connecting said second connecting pad and said first connecting pad of said respective element-formation surfaces that face each other.

* * * * *